(12) United States Patent
Shen (10) Patent No.: US 11,283,474 B2
(45) Date of Patent: Mar. 22, 2022

(54) BASEBAND FREQUENCY SELECTIVE MAGNITUDE AND PHASE ADJUSTMENT FOR WIDEBAND DOHERTY POWER AMPLIFIER

(71) Applicant: Telefonaktiebolaget LM Ericsson (publ), Stockholm (SE)

(72) Inventor: Yiming Shen, Ottawa (CA)

(73) Assignee: Telefonaktiebolaset LM Ericsson (Publ), Stockholm (SE)

( * ) Notice: Subject to any disclaimer, the term of this patent is extended or adjusted under 35 U.S.C. 154(b) by 0 days.

(21) Appl. No.: 17/041,304

(22) PCT Filed: Mar. 26, 2018

(86) PCT No.: PCT/IB2018/052054
§ 371 (c)(1),
(2) Date: Sep. 24, 2020

(87) PCT Pub. No.: WO2019/186229
PCT Pub. Date: Oct. 3, 2019

(65) Prior Publication Data
US 2021/0028802 A1  Jan. 28, 2021

(51) Int. Cl.
*H04B 1/04* (2006.01)
*H03F 1/02* (2006.01)
(Continued)

(52) U.S. Cl.
CPC ............ *H04B 1/04* (2013.01); *H03F 1/0288* (2013.01); *H03F 1/42* (2013.01); *H03F 3/245* (2013.01);
(Continued)

(58) Field of Classification Search
None
See application file for complete search history.

(56) References Cited

U.S. PATENT DOCUMENTS 9,503,028 B2 * 11/2016 Ma .................... H03F 1/0288
9,531,329 B2 * 12/2016 Tanimoto ............ H03F 3/211
(Continued)

FOREIGN PATENT DOCUMENTS

| EP | 2658116 A1 * | 10/2013 | ........... H03F 1/0288 |
| EP | 2658116 A1 | 10/2013 | |
| EP | 3002873 A1 | 4/2016 | |

OTHER PUBLICATIONS

International Search Report dated Nov. 28, 2018 for International Application No. PCT/IB2018/052054 filed on Mar. 26, 2018, consisting of 14-pages.
(Continued)

*Primary Examiner* — Pablo N Tran
(74) *Attorney, Agent, or Firm* — Christopher & Weisberg, P.A.

(57) ABSTRACT

A method and transmitter for a Doherty power amplifier are provided. According to one aspect, a radio transmitter includes, for each carrier frequency, a filter, a main path and a peak path. The filter suppresses signals outside the selected frequency band to produce a filter output. The main path is configured to make a first adjustment of a magnitude and phase of the filter output to produce a main path signal. The peak path is configured to make a second adjustment of the magnitude and phase of the filter output to produce a peak path signal, a difference between the first adjustment and the second adjustment being dependent on the carrier frequency. Main path signals for each carrier frequency produce a composite main path signal. Peak path signals for each carrier frequency produce a composite peak path signal.

14 Claims, 6 Drawing Sheets

(51) Int. Cl.
*H03F 3/19* (2006.01)
*H03F 1/42* (2006.01)
*H03F 3/24* (2006.01)

(52) U.S. Cl.
CPC .... *H03F 2200/165* (2013.01); *H03F 2200/36* (2013.01); *H03F 2200/451* (2013.01); *H04B 2001/045* (2013.01)

(56) References Cited

U.S. PATENT DOCUMENTS

| | | | |
|---|---|---|---|
| 9,634,615 B1* | 4/2017 | Ahmed | H03F 3/211 |
| 9,667,199 B1* | 5/2017 | McLaren | H03F 1/56 |
| 9,685,915 B2* | 6/2017 | Blednov | H03F 3/211 |
| 10,547,279 B2* | 1/2020 | Watkins | H03F 1/56 |
| 10,756,677 B2* | 8/2020 | Lehtola | H03F 3/211 |
| 10,833,634 B2* | 11/2020 | Chan | H03F 3/213 |
| 2015/0263677 A1* | 9/2015 | Jones | H03F 3/193 |
| | | | 330/295 |
| 2018/0034418 A1* | 2/2018 | Blednov | H03F 3/211 |
| 2018/0287566 A1* | 10/2018 | Komatsuzaki | H03H 7/0115 |
| 2020/0321918 A1* | 10/2020 | Grebennikov | H03F 1/0288 |

OTHER PUBLICATIONS

Raymond Pengelly et al; Doherty's Legacy: A History of the Doherty Power Amplifier from 1936 to the Present Day; IEEE Microwave Magazine; Feb. 1, 2016; pp. 41-58; vol. 17, No. 2; NJ US; consisting of 18-pages.

* cited by examiner

BASEBAND FREQUENCY SELECTIVE MAGNITUDE AND PHASE ADJUSTMENT FOR WIDEBAND DOHERTY POWER AMPLIFIER

CROSS-REFERENCE TO RELATED APPLICATIONS

This application is a Submission Under 35 U.S.C. § 371 for U.S. National Stage Patent Application of International Application Number: PCT/IB2018/052054, filed Mar. 26, 2018 entitled "BASEBAND FREQUENCY SELECTIVE MAGNITUDE AND PHASE ADJUSTMENT FOR WIDEBAND DOHERTY POWER AMPLIFIER," the entirety of which is incorporated herein by reference.

TECHNICAL FIELD

Wireless communication and in particular, baseband frequency selective magnitude and phase adjustment in a radio transmitter.

BACKGROUND

Figure 1:
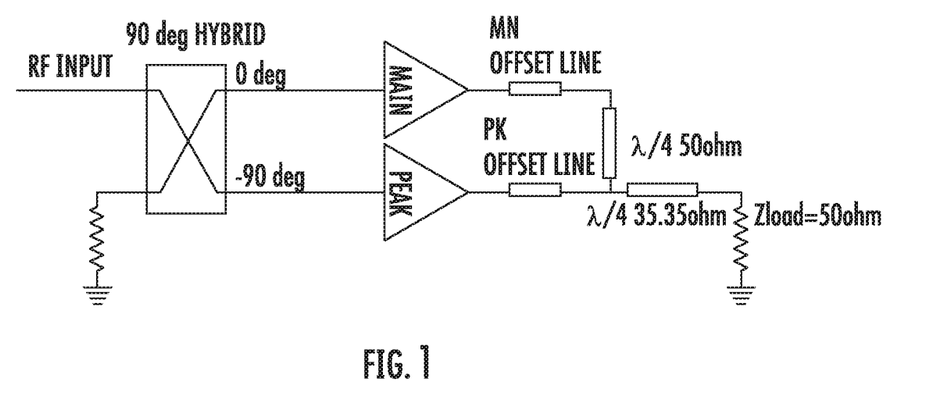
FIG. 1 is a block diagram of a Doherty power amplifier.

Doherty power amplifiers (PA) have been widely used in radio access networks. As shown in FIG. 1, a typical Doherty PA includes two branches, a main branch and a peak branch. Typically, the main branch has a class A or class AB amplifier operating near its saturation region to amplify the input signal linearly when the input signal is well below its peak value and the peak branch has a class C amplifier to amplify the input signal when it is at or near its peak value. The outputs of the main branch and the peak branch are combined to produce an amplified version of the input signal with minimal distortion. To achieve optimal PA performance and better manufacturing yield, the phase and magnitude differences between the two branches should be optimized.

The industry is shifting focus to wideband Doherty PAs in radio access networks where the PA should transmit multicarrier signals concurrently over several different frequency bands. For wideband Doherty PAs, the optimum magnitude and phase differences between the main branch and the peak branch are quite different for different frequencies.

Conventionally, Doherty PAs have constant magnitude and phase differences between the main and peak branches at radio frequencies (RF) across a narrow band when transmitting power at two different frequency bands simultaneously without significant degradation. However, for the wideband applications, where the carrier frequencies are separated by a few hundreds of MHz, the magnitude and phase differences between the main and peak branch are significant. If the optimum magnitude and phase are applied at the lower side of the frequency band, the PA performance will significantly degrade at the higher side of the frequency band and vice versa. Conventionally, an optimum magnitude and phase difference at the center band will be applied across the whole frequency band. However, PA performance will be compromised, especially in wideband applications, where multicarrier signals are transmitted concurrently over a large bandwidth.

SUMMARY

Some embodiments advantageously provide a method and transmitter for improving efficiency and linearity, as well as manufacturing yield, of Doherty PAs as compared with known Doherty PAs, for wideband applications. According to one aspect, magnitude and phase difference between the main and peak branches of the Doherty amplifier are separately configured to achieve better performance for wideband applications.

As the industry moves toward wideband and dual band applications, Doherty power amplifiers (PA) should efficiently transmit power at two different bands which can be separated by a few hundreds of MHz. In particular, the main and peak branches of the Doherty PA should have different magnitude and phase differences, to achieve good performance, or even acceptable performance over a wide frequency band. When the magnitude and phase delta of the main and peak branch are relatively constant over a large bandwidth, Doherty PA performance degrades significantly. Accordingly, embodiments provide for two different magnitude and phase difference applications at two different frequency bands to achieve significantly improved performance as compared with existing Doherty PAs.

According to one aspect, a method includes, for each carrier frequency of a plurality of carrier frequencies: filtering a wideband communication signal to select a frequency band containing the carrier frequency and suppressing signals outside the selected frequency band to produce a filter output. Also, for each carrier frequency, the method includes applying the filter output to a main path and a peak path, the main path configured to make a first adjustment of a magnitude and phase of the filter output to produce a main path signal and the peak path configured to make a second adjustment of the magnitude and phase of the filter output to produce a peak path signal, a difference between the first adjustment and the second adjustment being dependent on the carrier frequency. When all carriers are processed, the method includes combining the main path signals for each carrier frequency of the plurality of carrier frequencies to produce a composite main path signal. The method also includes combining the peak path signals for each carrier frequency of the plurality of carrier frequencies to produce a composite peak path signal.

According to this aspect, in some embodiments, the process includes inputting the main path signal to a main path of a Doherty amplifier and inputting the peak path signal to a peak path of the Doherty amplifier. In some embodiments, the process further includes upconverting the composite main path signal using a first upconverter and upconverting the composite peak path signal by a second upconverter. In some embodiments, the process further includes amplifying the upconverted composite main path signal in a main amplifier and amplifying the upconverted composite peak path signal in a peak amplifier. In some embodiments, the process further includes combining an output of the main amplifier with an output of the peak amplifier by an impedance network to produce a radio frequency output signal. In some embodiments, the filter, main path and peak path are implemented in one of an application specific integrated circuit and a field programmable gate array. In some embodiments, the filter, main path and peak path are implemented in a radio frequency integrated circuit. In some embodiments, the wideband communication signal is a baseband signal.

According to another aspect, in some embodiments, a radio transmitter is provided for radio transmission and configured for multiband and/or wideband operation. The transmitter includes, for each carrier frequency of a plurality of carrier frequencies of the multiband/wideband operation, a filter configured to filter a wideband communication signal to select a frequency band containing the carrier frequency and to suppress signals outside the selected frequency band to produce a filter output. Also, for each carrier frequency, a main path is configured to make a first adjustment of a magnitude and phase of the filter output to produce a main path signal and a peak path configured to make a second adjustment of the magnitude and phase of the filter output to produce a peak path signal, a difference between the first adjustment and the second adjustment being dependent on the carrier frequency. A first adder is configured to combine the main path signals for each carrier frequency of the plurality of carrier frequencies to produce a composite main path signal, and a second adder is configured to combine the peak path signals for each carrier frequency of the plurality of carrier frequencies to produce a composite peak path signal.

According to this aspect, in some embodiments, the transmitter includes a Doherty amplifier having a main amplifier path to receive the main path signal and having a peak amplifier path to receive the peak path signal. In some embodiments, the transmitter includes a first upconverter configured to upconvert the composite main path signal and a second upconverter configured to upconvert the composite peak path signal. In some embodiments, the transmitter includes a main amplifier configured to amplify the upconverted composite main path signal and a peak amplifier configured to amplify the upconverted composite peak path signal. In some embodiments, the transmitter includes an adder configured to combine an output of the main amplifier with an output of the peak amplifier to produce a radio frequency output signal. In some embodiments, the filter, main path and peak path are implemented in one of an application specific integrated circuit and a field programmable gate array. In some embodiments, the filter, main path and peak path are implemented in a radio frequency integrated circuit. In some embodiments, wherein the wideband communication signal is a baseband signal.

According to another aspect, a transmitter is provided that includes a first filter configured to filter a wideband communication signal to produce a first filtered signal having a first carrier frequency and a second filter configured to filter the wideband communication signal to produce a second filtered signal having a second carrier frequency. The transmitter also includes a first main path configured to perform a first adjustment of the first filtered signal to produce a first adjusted main path signal and a first peak path configured to perform a second adjustment of the first filtered signal to produce a first adjusted peak path signal, a difference between the first and second adjustment based on the first carrier frequency. The transmitter also includes a second main path configured to perform a third adjustment of the second filtered signal to produce a second adjusted main path signal and a second peak path configured to perform a fourth adjustment of the second filtered signal to produce a second adjusted peak path signal, a difference between the third and fourth adjustment based on the second carrier frequency. The transmitter also includes a main path adder configured to combine the first and second adjusted main path signals to produce a combined main path signal, and a peak path adder configured to combine the first and second adjusted peak path signal to produce a combined peak path signal.

According to this aspect, in some embodiments, the transmitter includes a main path upconverter configured to upconvert the combined main path signal and a peak path upconverter configured to upconvert the combined peak path signal. In some embodiments, the transmitter includes a Doherty amplifier configured to receive and amplify the upconverted combined path signal in a main amplifier and to receive and amplify the upconverted combined peak path signal in a peak amplifier. In some embodiments, the first and second filters, first and second main paths and first and second peak paths are implemented in one of an application specific integrated circuit and a field programmable gate array. In some embodiments, the first and second filters, first and second main paths and first and second peak paths are implemented in a radio frequency integrated circuit. In some embodiments, the wideband communication signal is a baseband signal.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Before describing in detail exemplary embodiments, it is noted that the embodiments reside primarily in combinations of apparatus components and processing steps related to baseband frequency selective magnitude and phase adjustment in a radio transmitter. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In some embodiments, the magnitude and phase differences between main and peak branches of a Doherty power amplifier are selectively adjusted and configured separately to achieve better performance for wideband application.

Figure 2:
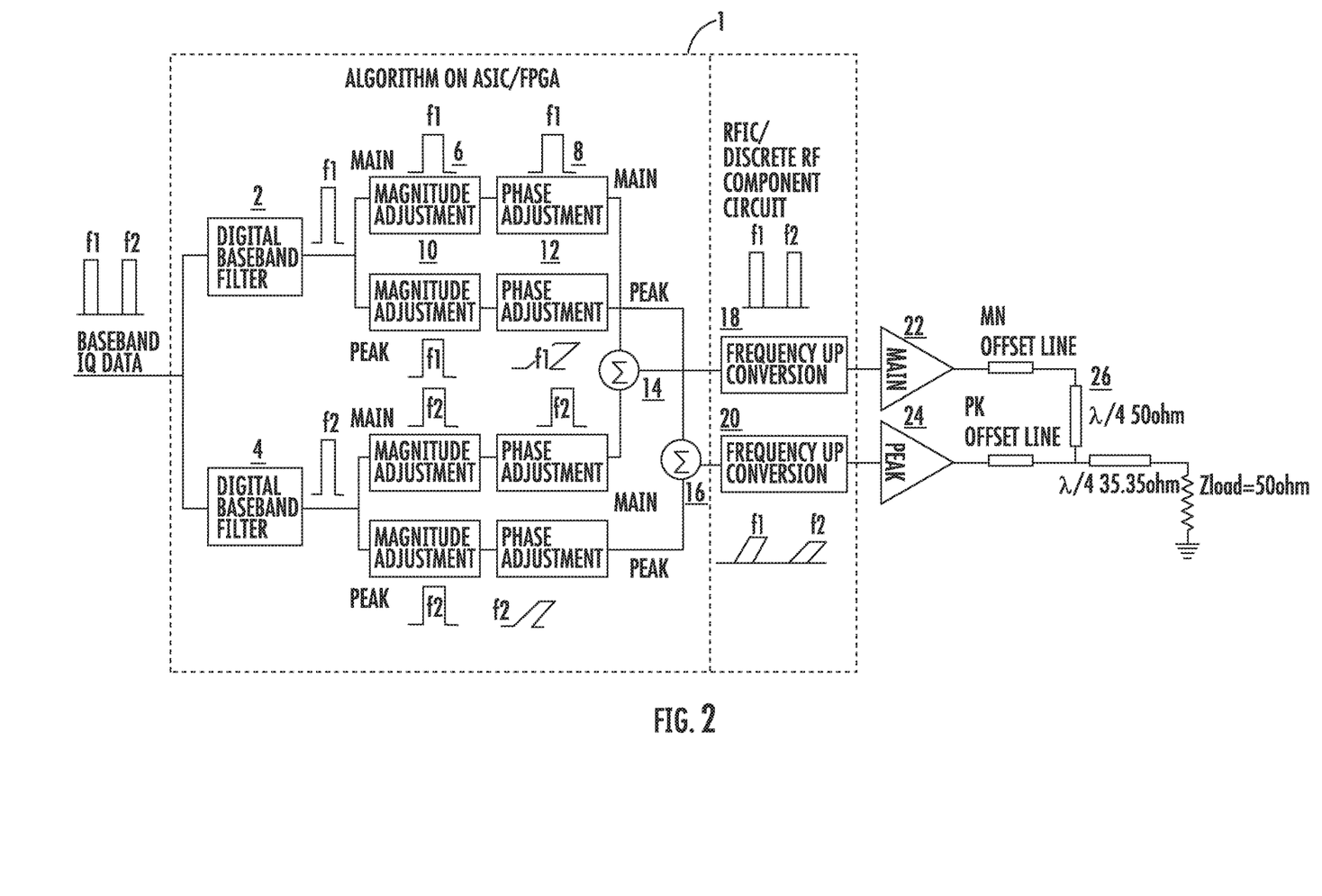
FIG. 2 is a block diagram of a first embodiment of an amplifier constructed in accordance with principles set forth herein.
Figure 3:
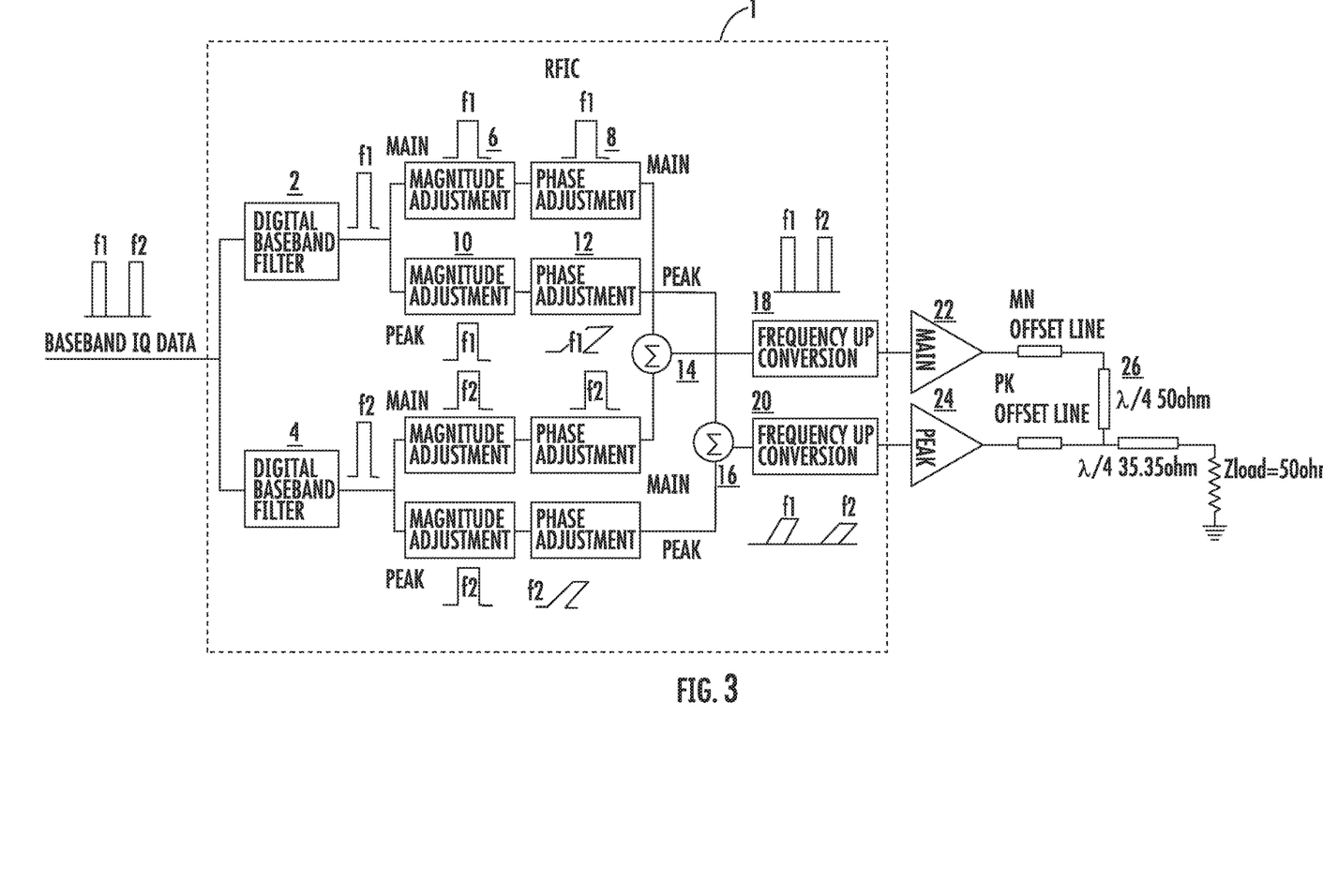
FIG. 3 is a block diagram of a second embodiment of an amplifier constructed in accordance with principles set forth herein.

As shown in FIG. 2 and FIG. 3, a radio transmitter 1 receives baseband signal containing signals at frequency f1 and frequency f2. The radio transmitter 1 is implemented at least in part by an application specific integrated circuit (ASIC) or a field programmable gate array (FPGA) as in FIG. 2 or an RF integrated circuit (RFIC) as in FIG. 3. Thus, in FIG. 2 an ASIC or FPGA performs baseband processing while frequency up conversion is implemented in an integrated circuit or discrete components, whereas in FIG. 3 baseband signal processing and frequency up conversion are performed in one RFIC.

As shown in FIGS. 2 and 3, the incoming baseband signal containing f1 and f2 is passed through filters 2 and 4 (which may be digital baseband filters) to select f1 and f2 in the upper and lower branches, respectively. In the upper branch, the signal at f1 is separated into a main branch and a peak branch. The main branch of the upper branch has a magnitude adjustment 6 and a phase adjustment 8 to produce an upper main branch signal at f1 and the peak branch of the upper branch has a magnitude adjustment 10 and a phase adjustment 12 to produce an upper peak branch signal at f1. A similar structure is implemented in the lower branch to produce a lower main branch signal at f2 and a lower peak branch signal at f2. The magnitude and phase adjustments in each branch are configured for the particular frequency, f1 or f2, of the signal in the branch.

After achieving a magnitude and phase difference between the main and peak branch for each single baseband signal at f1 in the upper branch and at f2 for the lower branch, the upper main branch signal at f1 is added, via and adder 14, to the lower main branch signal at f2 to provide a composite main path signal to be input to a main branch of a Doherty PA via frequency up conversion unit 18. Likewise, the upper peak branch signal at f1 is added, via adder 16, to the lower peak branch signal at f2 to provide a composite peak path signal to be input to a peak branch of the Doherty PA via frequency up conversion unit 20. The upconverted composite main path signal is amplified by a main amplifier 22 and the upconverted composite peak path signal is amplified by a peak amplifier 24.

By applying the proposed signal processing method, the magnitude and phase difference between the main and peak branch will be configured separately to achieve better PA performance in wideband carrier aggregation applications. Note that although a two way Doherty PA is shown in FIGS. 2 and 3, the methods described herein may apply to multi-way Doherty PAs. Also note that a wideband communication signal as referred to herein includes dual band and multiband signals as well as wideband signals.

Thus, in some embodiments, a radio transmitter 1 is provided for radio transmission and configured for multi-band and/or wideband operation. The transmitter 1 includes, for each carrier frequency of a plurality of carrier frequencies of the multiband/wideband operation, a filter 2, 4, configured to filter a wideband communication signal to select a frequency band containing the carrier frequency and to suppress signals outside the selected frequency band to produce a filter output. Also, for each carrier frequency, a main path is configured to make a first adjustment of a magnitude 6 and phase 8 of the filter output to produce a main path signal and a peak path configured to make a second adjustment of the magnitude 10 and phase 12 of the filter output to produce a peak path signal, a difference between the first adjustment and the second adjustment being dependent on the carrier frequency. A first adder 14 is configured to combine the main path signals for each carrier frequency of the plurality of carrier frequencies to produce a composite main path signal, and a second adder 16 is configured to combine the peak path signals for each carrier frequency of the plurality of carrier frequencies to produce a composite peak path signal.

In some embodiments, the transmitter includes a Doherty amplifier having a main amplifier 22 path to receive the main path signal and having a peak amplifier 24 path to receive the peak path signal. In some embodiments, the transmitter includes a first upconverter 18 configured to upconvert the composite main path signal and a second upconverter 20 configured to upconvert the composite peak path signal. In some embodiments, the transmitter includes a main amplifier 22 configured to amplify the upconverted composite main path signal and a peak amplifier 24 configured to amplify the upconverted composite peak path signal. In some embodiments, the transmitter 1 includes an adder 26 configured to combine an output of the main amplifier with an output of the peak amplifier to produce a radio frequency output signal. In some embodiments, the filter 2, main path and peak path are implemented in one of an application specific integrated circuit and a field programmable gate array. In some embodiments, the filter 2, main path and peak path are implemented in a radio frequency integrated circuit. In some embodiments, the wideband communication signal is a baseband signal.

According to another aspect, a transmitter 1 is provided that includes a first filter 2 configured to filter a wideband communication signal to produce a first filtered signal having a first carrier frequency and a second filter 4 configured to filter the wideband communication signal to produce a second filtered signal having a second carrier frequency. The transmitter 1 also includes a first main path configured to perform a first adjustment of the first filtered signal to produce a first adjusted main path signal and a first peak path configured to perform a second adjustment of the first filtered signal to produce a first adjusted peak path signal, a difference between the first and second adjustment based on the first carrier frequency. The transmitter 1 also includes a second main path configured to perform a third adjustment of the second filtered signal to produce a second adjusted main path signal and a second peak path configured to perform a fourth adjustment of the second filtered signal to produce a second adjusted peak path signal, a difference between the third and fourth adjustment based on the second carrier frequency. The transmitter 1 also includes a main path adder 14 configured to combine the first and second adjusted main path signals to produce an adder main path signal, and a peak path adder 16 configured to combine the first and second adjusted peak path signal to produce a combined peak path signal.

In some embodiments, the transmitter includes a main path upconverter 18 configured to upconvert the combined main path signal and a peak path upconverter 20 configured to upconvert the combined peak path signal. In some embodiments, the transmitter 1 includes a Doherty amplifier configured to receive and amplify the upconverted combined path signal in a main amplifier 22 and to received and amplify the upconverted combined peak path signal in a peak amplifier 24. In some embodiments, the first and second filters 2 and 4, first and second main paths and first and second peak paths are implemented in one of an application specific integrated circuit and a field programmable gate array. In some embodiments, the first and second filters 2 and 4, first and second main paths and first and second peak paths are implemented in a radio frequency integrated circuit. In some embodiments, the wideband communication signal is a baseband signal.

Figure 4:
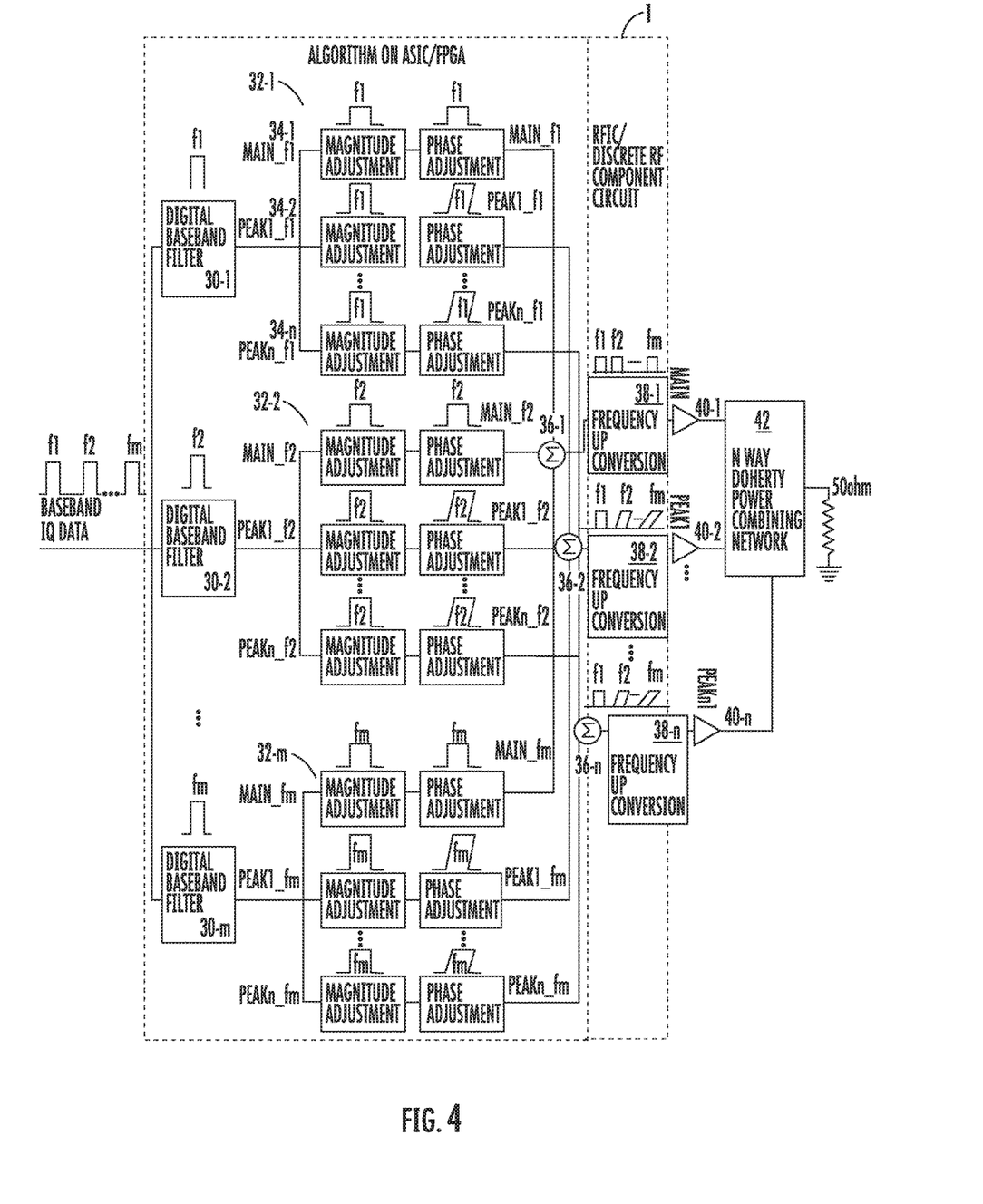
FIG. 4 is a block diagram of an n-way amplifier constructed in accordance with principles set forth herein.

While FIGS. 2 and 3 illustrate the present disclosure for an exemplary 2-way amplifier, FIG. 4 is a block diagram of an n-way amplifier, where n is an integer greater than two, constructed according to principles set forth herein. As shown in FIG. 4, a radio transmitter receives a baseband signal containing signals at frequencies f1, f2 ... $f_M$. The radio transmitter may be implemented at least in part by an ASIC or FPGA or by an RFIC. The incoming baseband signal containing f1, f2 ... $f_M$ is passed through a filter 30-1 to select f1, 30-2 to select f2 ... 30-M to select $f_M$. The outputs of the filters 30-1, 30-2 ... 30-M are fed to one of M branches 32-1, 32-2 ... 32-M, respectively. In a branch, the output of the respective filter connected to the branch is fed to a main branch 34-1, a first peak branch 34-2 up to the Nth peak branch 34-N. In each branch, the signals are processed as described above in reference to FIGS. 2 and 3. The outputs of the main branches 34-1 of each branch 32-1, 32-2 ... 32-M are summed in adder 36-1. The outputs of the first peak branch 34-2 of each branch 32-1, 32-2 ... 32-M are summed in adder 36-2, and so on to adder 36-N. The output of each adder 36-1, 36-2 ... 36-N are sent to frequency up-converters 38-1, 38-2 ... 38-N, respectively. The up-converted signal from each up-converter is sent to a respective amplifier 40-1, 40-2 ... 40-N and combined by an n-way Doherty power combining network. In some embodiments and as a non-limiting example, N=M.

Figure 5:
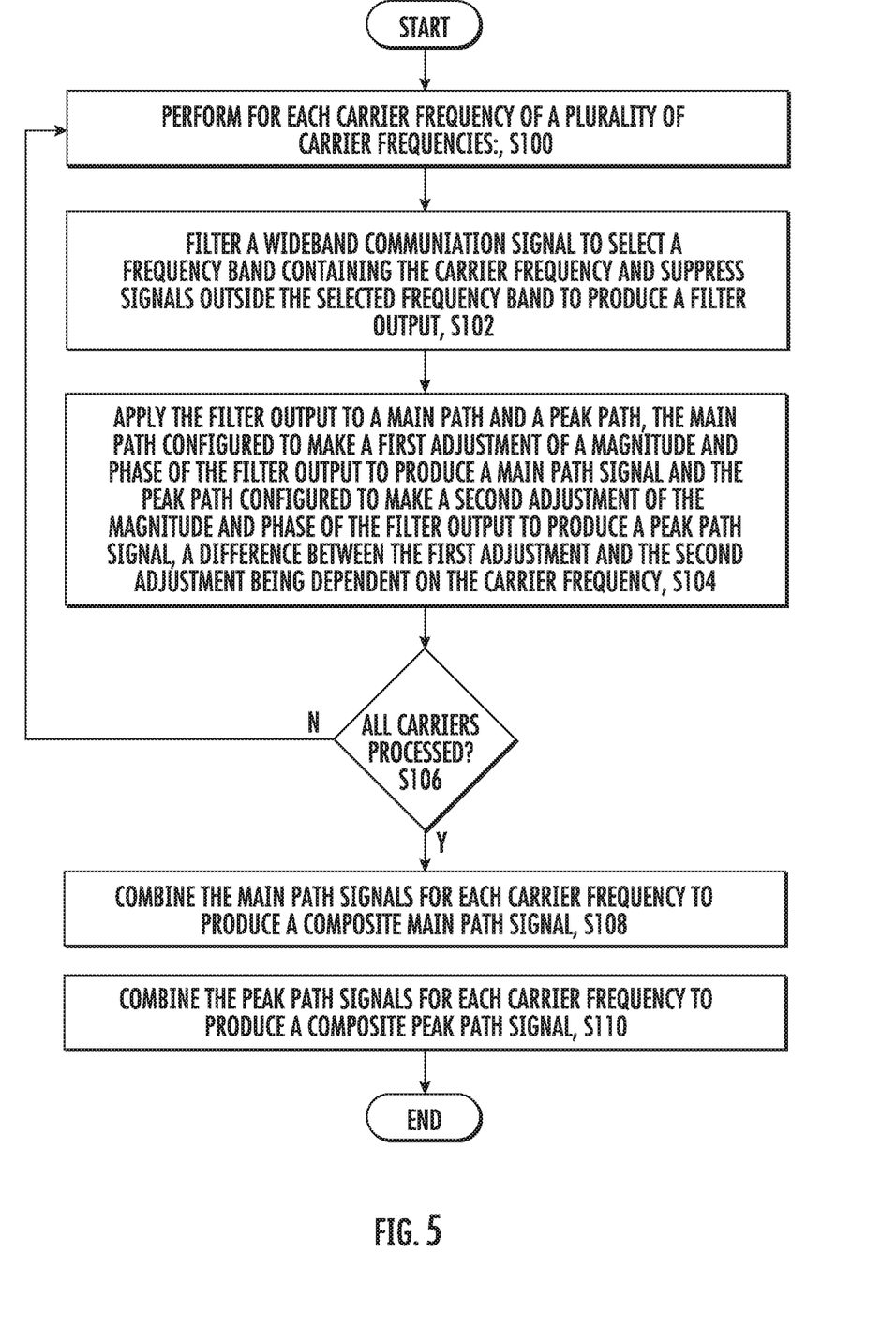
FIG. 5 is a flowchart of an exemplary process for operating a radio transmitter over a broad band in accordance with principles set forth herein.

FIG. 5 is a flowchart of an exemplary process for radio transmission for multiband and/or wideband operation. The process includes, for each carrier frequency of a plurality of carrier frequencies (block S100): filtering, via a filter 2, 4, a wideband communication signal to select a frequency band containing the carrier frequency and suppressing signals outside the selected frequency band to produce a filter output (block S102). Also, for each carrier frequency, the process includes applying the filter output to a main path and a peak path, the main path configured to make a first adjustment of a magnitude, via magnitude adjuster 6, and phase, via the phase adjuster 8, of the filter output to produce a main path signal and the peak path configured to make a second adjustment of the magnitude, via magnitude adjuster 10 and phase, via phase adjuster 12, of the filter output to produce a peak path signal, a difference between the first adjustment and the second adjustment being dependent on the carrier frequency (block S104). When all carriers are processed (block S106), the process includes combining the main path signals for each carrier frequency of the plurality of carrier frequencies to produce a composite main path signal (block S108). The process also includes combining the peak path signals for each carrier frequency of the plurality of carrier frequencies to produce a composite peak path signal (block S110).

In some embodiments, the process includes inputting the main path signal to a main path of a Doherty amplifier and inputting the peak path signal to a peak path of the Doherty amplifier. In some embodiments, the process further includes upconverting, via the upconverter 18, the composite main path signal using a first upconverter and upconverting, via the upconverter 20, the composite peak path signal by a second upconverter. In some embodiments, the process further includes amplifying the upconverted composite main path signal in a main amplifier 22 and amplifying the upconverted composite peak path signal in a peak amplifier 24. In some embodiments, the process further includes combining an output of the main amplifier with an output of the peak amplifier by an impedance network 26 to produce a radio frequency output signal. In some embodiments, the filter, main path and peak path are implemented in one of an application specific integrated circuit and a field programmable gate array. In some embodiments, a central processing (CPU) and other programmatic code can be used to implement the main path and peak path. In some embodiments, the filter, main path and peak path are implemented in a radio frequency integrated circuit. In some embodiments, the wideband communication signal is a baseband signal.

Figure 6:
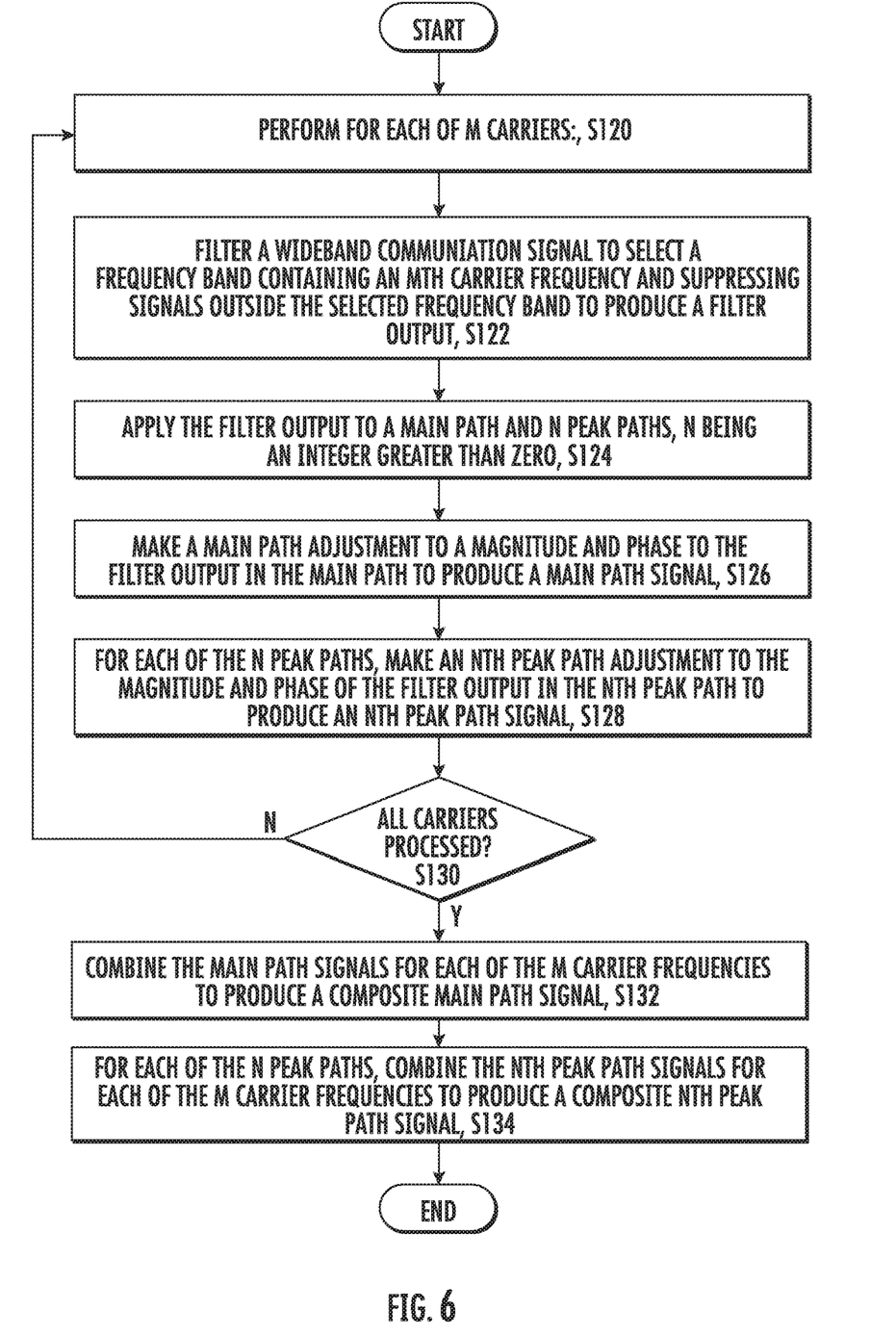
FIG. 6 is a flowchart of an exemplary process for radio transmission for multiband and/or wideband operation using an n-way Doherty amplifier.

FIG. 6 is a flowchart of an exemplary process for radio transmission for multiband and/or wideband operation using an n-way Doherty amplifier. The process includes, for each carrier frequency of M carrier frequencies, M being an integer greater than one (S120): filtering, by a filter 30-m, a wideband communication signal to select a frequency band containing an mth carrier frequency and suppressing signals outside the selected frequency band to produce a filter output (S122); applying the filter output to a main path and N peak paths, N being an integer greater than zero (S124); making a main path adjustment to a magnitude and phase to the filter output in the main path to produce a main path signal (S126); and, for each of the N peak paths 34, making an nth peak path adjustment to the magnitude and phase of the filter output in the nth peak path to produce an nth peak path signal (S128). The process also includes combining the main path signals for each of the M carrier frequencies to produce a composite main path signal (S132). The process further includes for each of the N peak paths, combining the nth peak path signals for each of the M carrier frequencies to produce a composite nth peak path signal (S134).

In some embodiments, the process includes up-converting the composite main path signal to an up-converted main path signal; and for each of the N peak paths, up-converting, via an up-converter 38-n, the composite nth peak path signal to an up-converted nth peak path signal. In some embodiments, the process further includes inputting the up-converted main path signal to a main path 40-1 of a Doherty amplifier and inputting each up-converted nth peak path signal to a corresponding nth peak path 40-n of the Doherty amplifier. In some embodiments, the process further includes amplifying the up-converted composite main path signal in a main amplifier 40-1 and amplifying the up-converted nth peak path signal in an nth peak amplifier 40-n. In some embodiments, the method further includes combining an output of the main amplifier 40-1 with outputs of N peak amplifiers 40-n by an N-way Doherty power combining network 42 to produce a radio frequency output signal. It is understood that "N-way" is a general reference to an N+1 way Doherty amplifier having 1 main amplifier and N peak amplifiers. In some embodiments, the M filters 2, M main paths and M×N peak paths are implemented in one of an application specific integrated circuit and a field programmable gate array. In some embodiments, the M filters 2, M main paths and M×N peak paths are implemented in a radio frequency integrated circuit. In some embodiments, these paths may be implemented using a CPU and programmatic software code.

| Abbreviation | Explanation |
| --- | --- |
| PA | Power Amplifier |
| ASIC | Application Specific Integrated Circuit |
| FPGA | Field Programmable Gate Array |
| RFIC | Radio Frequency Integrated Circuit |
| RF | Radio Frequency |

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method for radio transmission, the method comprising:

for each carrier frequency of M carrier frequencies, M being an integer greater than one:
  filtering, by a filter, a wideband communication signal to select a frequency band containing an mth carrier frequency and suppressing signals outside the selected frequency band to produce a filter output; and
  applying the filter output to a main path and N peak paths, N being an integer greater than zero;
making a main path adjustment to a magnitude and phase to the filter output in the main path to produce a main path signal;
for each of the N peak paths, making an nth peak path adjustment to the magnitude and phase of the filter output in the nth peak path to produce an nth peak path signal;
  combining the main path signals for each of the M carrier frequencies to produce a composite main path signal; and
  for each of the N peak paths, combining the nth peak path signals for each of the M carrier frequencies to produce a composite nth peak path signal;
up-converting the composite main path signal to an up-converted main path signal;
for each of the N peak paths, up-converting the composite nth peak path signal to an up-converted nth peak path signal; and
inputting the up-converted main path signal to a main path of a Doherty amplifier and inputting each up-converted nth peak path signal to a corresponding nth peak path of the Doherty amplifier.

2. The method of claim 1, further comprising amplifying the up-converted composite main path signal in a main amplifier and amplifying the up-converted nth peak path signal in an nth peak amplifier.

3. The method of claim 2, further comprising combining an output of the main amplifier with outputs of N peak amplifiers by an impedance network to produce a radio frequency output signal.

4. The method of claim 1, wherein the M filters, M main paths and M×N peak paths are implemented in one of an application specific integrated circuit and a field programmable gate array.

5. The method of claim 1, wherein the M filters, M main paths and M×N peak paths are implemented in a radio frequency integrated circuit.

6. The method of claim 1, wherein the wideband communication signal is a baseband signal.

7. A radio transmitter, comprising:
for each carrier frequency of M carrier frequencies, M being an integer greater than one:
an mth filter configured to filter a wideband communication signal to select a frequency band containing an mth carrier frequency and suppressing signals outside the selected frequency band to produce an mth filter output; and
an mth main path configured to make an adjustment of an amplitude and phase of the mth filter output to produce an mth main path signal;
N peak paths, N being an integer greater than zero, each nth path configured to make an nth adjustment of an amplitude and phase of the mth filter output to produce an nth peak path signal for the mth carrier;
a first adder configured to combine the main path signals for each of the M carrier frequencies to produce a composite main path signal;
n adders for combining the nth peak path signals for each of the M carrier frequencies to produce a composite nth peak path signal;
a main path up-converter configured to up-convert the composite main path signal to an up-converted main path signal;
for each of the M peak paths, a mth path up-converter configured to up-convert the composite mth peak path signal to an up-converted mth peak path signal; and
a Doherty amplifier having a main amplifier path to receive the up-converted main path signal and having M peak amplifier paths, each of the M peak amplifiers paths configured to receive an m up-converted peak path signal.

8. The transmitter of claim 7, further comprising a main amplifier configured to amplify the received up-converted main path signal and, for each of the M peak amplifier paths, a peak amplifier configured to amplify the mth up-converted peak path signal.

9. The transmitter of claim 8, further comprising an adder configured to combine an output of the main amplifier with output of the M peak amplifiers to produce a radio frequency output signal.

10. The transmitter of claim 7, wherein the M filters, M main paths and M×N peak paths are implemented in one of an application specific integrated circuit and a field programmable gate array.

11. The transmitter of claim 7, wherein the M filter, N main paths and M×N peak paths are implemented in a radio frequency integrated circuit.

12. The transmitter of claim 7, wherein the wideband communication signal is a baseband signal.

13. A transmitter, comprising:
a first filter configured to filter a wideband communication signal to produce a first filtered signal having a first carrier frequency;
a second filter configured to filter the wideband communication signal to produce a second filtered signal having a second carrier frequency;
a first main path configured to perform a first adjustment of the first filtered signal to produce a first adjusted main path signal;
a first peak path configured to perform a second adjustment of the first filtered signal to produce a first adjusted peak path signal, a difference between the first and second adjustment based on the first carrier frequency;
a second main path configured to perform a third adjustment of the second filtered signal to produce a second adjusted main path signal;
a second peak path configured to perform a fourth adjustment of the second filtered signal to produce a second adjusted peak path signal, a difference between the third and fourth adjustment based on the second carrier frequency;
a main path adder configured to combine the first and second adjusted main path signals to produce a combined main path signal;
a peak path adder configured to combine the first and second adjusted peak path signal to produce a combined peak path signal;
a main path upconverter configured to upconvert the combined main path signal;
a peak path upconverter configured to upconvert the combined peak path signal; and
a Doherty amplifier configured to receive and amplify the upconverted combined path signal in a main amplifier and to received and amplify the upconverted combined peak path signal in a peak amplifier.

14. The transmitter of claim 13, wherein the first and second filters, first and second main paths and first and second peak paths are implemented in one of an application specific integrated circuit and a field programmable gate array.

* * * * *